(12) United States Patent
Salter, III et al.

(10) Patent No.: US 7,362,610 B1
(45) Date of Patent: Apr. 22, 2008

(54) PROGRAMMING METHOD FOR NON-VOLATILE MEMORY AND NON-VOLATILE MEMORY-BASED PROGRAMMABLE LOGIC DEVICE

(75) Inventors: Robert M. Salter, III, Saratoga, CA (US); Kyung Joon Han, Palo Alto, CA (US); Sung-Rae Kim, San Jose, CA (US); Nigel Chan, Sunnyvale, CA (US)

(73) Assignee: Actel Corporation, Mountain View, CA (US)

( * ) Notice: Subject to any disclaimer, the term of this patent is extended or adjusted under 35 U.S.C. 154(b) by 0 days.

(21) Appl. No.: 11/319,751

(22) Filed: Dec. 27, 2005

(51) Int. Cl.
*G11C 11/34* (2006.01)

(52) U.S. Cl. .................. 365/185.02; 365/185.22; 365/185.24; 365/185.3; 365/185.33

(58) Field of Classification Search ........... 365/185.02, 365/185.22, 185.29, 185.33, 185.19
See application file for complete search history.

(56) References Cited

U.S. PATENT DOCUMENTS

| | | | |
|---|---|---|---|
| 5,483,486 A | | 1/1996 | Javanifard et al. |
| 5,526,307 A | * | 6/1996 | Yiu et al. ............... 365/185.01 |
| 5,594,360 A | | 1/1997 | Wojciechowski |
| 5,671,179 A | | 9/1997 | Javanifard |
| 5,907,700 A | | 5/1999 | Talreja et al. |
| 5,944,837 A | | 8/1999 | Talreja et al. |
| 6,088,268 A | | 7/2000 | Gupta et al. |
| 6,166,959 A | | 12/2000 | Gupta et al. |
| 6,504,760 B1 | | 1/2003 | Tedrow |
| 6,597,606 B2 | | 7/2003 | Tedrow |
| 6,711,058 B1 | * | 3/2004 | Hirano ................. 365/185.11 |
| 6,724,662 B2 | | 4/2004 | Manea |
| 6,980,471 B1 | * | 12/2005 | Samachisa ............. 365/185.02 |
| 2005/0162914 A1 | * | 7/2005 | Jung ..................... 365/185.18 |

\* cited by examiner

*Primary Examiner*—Anh Phung
*Assistant Examiner*—Han Yang
(74) *Attorney, Agent, or Firm*—Sierra Patent Group, Ltd.

(57) ABSTRACT

A method for programming a flash memory cell comprises providing input data to the flash cell and providing a segmented programming pulse to the flash memory cell. The segmented programming pulse includes programming segments, each successive programming segment including a programming potential higher than the programming potential used in a previous programming segment, each programming segment followed by a zero-potential compare segment. The output of the flash memory cell is compared with the input data during the compare segment after each programming segment. The segmented programming pulse is terminated if the output of the flash memory cell matches the input data. The programming potential in each programming segment is increased during the programming segment. The programming potential in successive segments is either is increased or stepped up to the final value of the previous programming segment.

17 Claims, 6 Drawing Sheets

PROGRAMMING METHOD FOR NON-VOLATILE MEMORY AND NON-VOLATILE MEMORY-BASED PROGRAMMABLE LOGIC DEVICE

BACKGROUND OF THE INVENTION

1. Field of the Invention

The present invention relates to flash memory devices. More particularly, the present invention relates to a flash-based programmable logic device such as a field programmable gate array ("FPGA") where a high write-to-erase threshold separation is required.

2. The Prior Art

Flash electrically erasable programmable read-only memory (EEPROM) systems are commonly used as non-volatile memories in many electronic devices, including programmable logic devices such as FPGAs. Although the term "flash" often refers to memories that are bulk erased on a page-by-page, sector-by-sector, or entire array basis, the term is generally used in the art to refer to any electrically erasable (and re-programmable) non-volatile memory technology, regardless of the particular erase scheme.

The most common flash memory devices are comprised of floating-gate transistors, though other flash technologies such as SONOS, nano-crystal, and other non-volatile transistors are also known. For floating gate transistors, there is a distribution of rates at which charge moves onto or off of the floating gate. This may be caused, for example, by slight physical variations in each transistor such as variations in tunnel oxide layers. As compared with most memory cell transistors in a particular memory array, transistors in which charge moves relatively quickly into and out of the floating gate are described as "fast," and transistors in which charge moves relatively slowly into and out of the floating gate are described as "slow." These fast and slow bits are commonly referred to as "tail" bits because they comprise the "tails" of a normal distribution of memory cell program and erase speed and are the first and last flash memory cells to program and erase. A "cell" refers to a unit or "bit" of memory that may be comprised of a single transistor, multiple transistors, or transistors with additional circuitry. A flash memory cell may be used to store data or to configure the logic or routing of a programmable logic device such as an FPGA.

In traditional flash memory systems and flash-based programmable logic devices using Fowler-Nordheim programming and erase, a memory cell is programmed with a single write pulse on the cell's row (word) line simultaneously with a single write pulse on the cell's column (bit) line, which are together sufficient to create a voltage differential across the device to move electrons through a tunnel oxide onto the floating gate (or equivalent structure). The voltage of each pulse is ramped from an initial value to a final value over the course of the pulse (see FIG. 1B). An erase operation is similarly performed with single column and row pulses that ramp from an initial voltage to a final voltage.

Due to manufacturing tolerances there is a distribution in the behavior of cells within an addressed word line. That is, the degree to which a non-volatile transistor cell is programmed or erased (the amount of charge on the floating gate of the transistor) is not completely uniform across transistors, but varies according to a distribution. The separation between the amount of charge on the "least erased" transistor and the amount of charge on the "least programmed" transistor is the "window" of the device. The larger the window, the easier it is to read whether a device is erased or programmed. If there is no window (i.e., the distribution of programmed and erased transistors overlaps), then the device will not operate correctly. In a flash-based FPGA, a wider write-erase window is required than in a standard flash memory because, rather than just storing information, FPGA cells perform logic operations. Therefore, FPGA cells must be either turned on hard enough to operate as low-resistance signal paths, or turned off hard enough that they reduce leakage during operation.

Programming of the non-volatile programmable cells in a flash-based programmable logic device is generally performed on a "row-by-row" basis. In one example, a row line or "wordline" is connected to the control gates of a row of non-volatile transistors in an array. When cells in a given row are to be programmed, a program voltage is applied to the row line in a pulse, as described above. Therefore, the control gates of all cells in the row receive the program voltage applied to the row line. Each cell in the row is also connected to a column line or "bitline." For the cells to be programmed, a program voltage is applied to the column line of each cell to be programmed simultaneously with the application of the program voltage to the row line. As shown in FIG. 1B, the program voltages of the row and column lines are generally of opposite signs to create a large voltage differential across the cell.

While the non-volatile transistors selected for programming are being programmed, neighboring transistors may be affected by the large programming voltages applied in the vicinity, especially the voltage applied to the control gates of the unselected devices via the row lines. This is referred to as "disturb" and is illustrated in FIG. 1A.

FIG. 1A shows a graphic representation of the distribution of voltages for programmed and erased non-volatile memory cells. The distributions of FIG. 1A can be thought of to represent the voltages on the floating gates (or other charge-holding structures) of non-volatile transistors. It is not practical, however, to actually measure the voltage on a floating gate, so typically a proxy-measurement is used to develop the data represented in FIG. 1A. This proxy measurement may be, for example, a measurement of the control gate voltage needed to program or erase the cell, or the threshold voltage of a programmed or erased cell.

FIG. 1A shows a distribution of erased cell floating gate voltages 2 following a bulk erase of cells on a device. Following the bulk erase, selected cells in the device are programmed. The distribution of voltages on programmed cells is shown as curve 6. Curve 4 represents the voltages on erased devices that were not programmed following the bulk erase operation. Curve 4 is shifted from curve 2 due to the disturb effects of the programming operation. The effects of disturb, as illustrated in FIG. 1A, are to move the distribution of charges present on the erased devices closer to the distribution present on programmed devices. This leads to a narrower window 8 and, if disturb is high enough, could lead to errors on the device.

In order to partially reduce the disturb effect of the program voltage placed on the row line of a row containing cells being programmed, an inhibit voltage is placed on the column lines of the cells in the row that are not being programmed. The inhibit voltage is typically of opposite sign to the column line program voltage, and helps reduce the voltage differential across the cells that are not being programmed, thereby reducing disturb effects. The inhibit voltage is not sufficient, however, to eliminate disturb effects, or even to reduce them to acceptable levels in many cases.

Applying programming voltages to transistors to be programmed in a simple linear ramp, as shown in FIG. 1B results in the effects shown in FIG. 1A. The gate disturb induced on near-by transistors during the write pulse pushes the erased population towards the programmed population, narrowing the cell window. During the write pulse, since the program voltage is applied to an entire row, cells ("bits") with different physical characteristics are selected. Fast bits tend to be programmed more quickly and slow bits need either longer or higher write voltages to meet the intended program level. Thus, for a single write pulse mode, the write pulse must be parameterized suitably to accommodate the slow-moving bits (i.e., to program the transistors most "resistant" to programming) in the program distribution. A programming method using a single pulse write mode cannot differentiate the row by row variation in device characteristics across the whole core area. It results in wider threshold distribution especially on the erase bit due to increasing the gate disturb on the erased population. Tighter erase bit distribution is especially important for a flash-based FPGA to have target switch performance.

Various programming schemes for enhancing the distribution of threshold values of programmed and erased cells in non-volatile memory devices are known in the art. For example, Intel Corporation of Santa Clara, Calif. has employed a convergence scheme for creating a tighter distribution of programmed cells on flash memory devices employing channel hot electron ("CHE") program and erase. This method operates by applying a single low-voltage convergence pulse to programmed cells and then testing the devices to determine if the distribution of cell threshold voltages meets a predetermined standard.

BRIEF DESCRIPTION OF THE DRAWING FIGURES

DETAILED DESCRIPTION OF THE INVENTION

Those of ordinary skill in the art will realize that the following description of the present invention is illustrative only and not in any way limiting. Other embodiments of the invention will readily suggest themselves to such skilled persons.

Figure 1A:
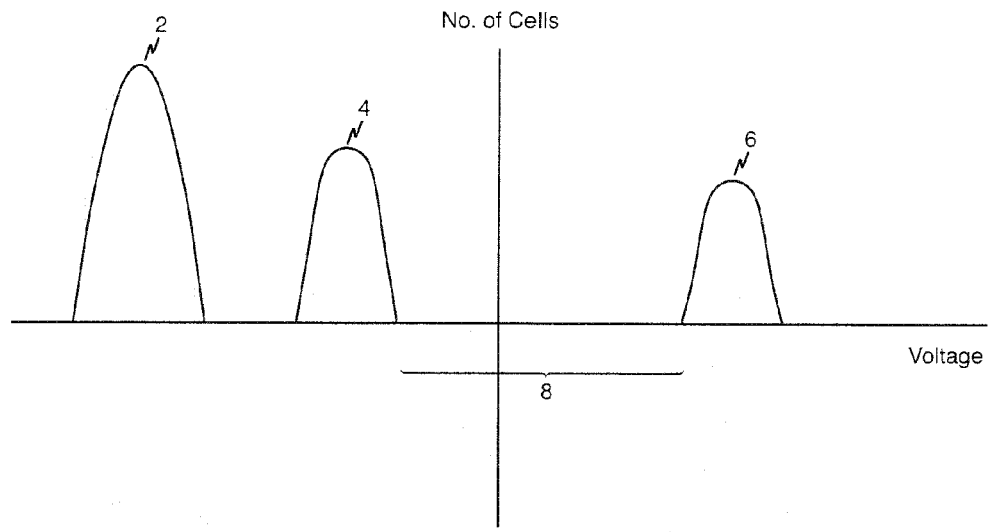
FIG. 1A is a diagram illustrating the distribution of voltages required to program and erase the memory cells on an illustrative flash memory device.
Figure 1B:
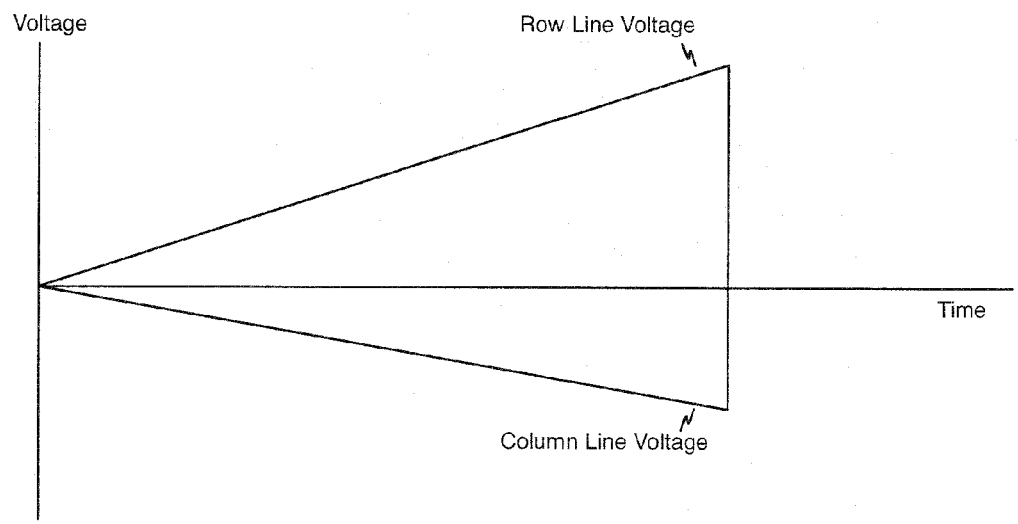
FIG. 1B is a diagram illustrating a ramping programming pulse used to program flash memory cells according to the prior art.
Figure 2:
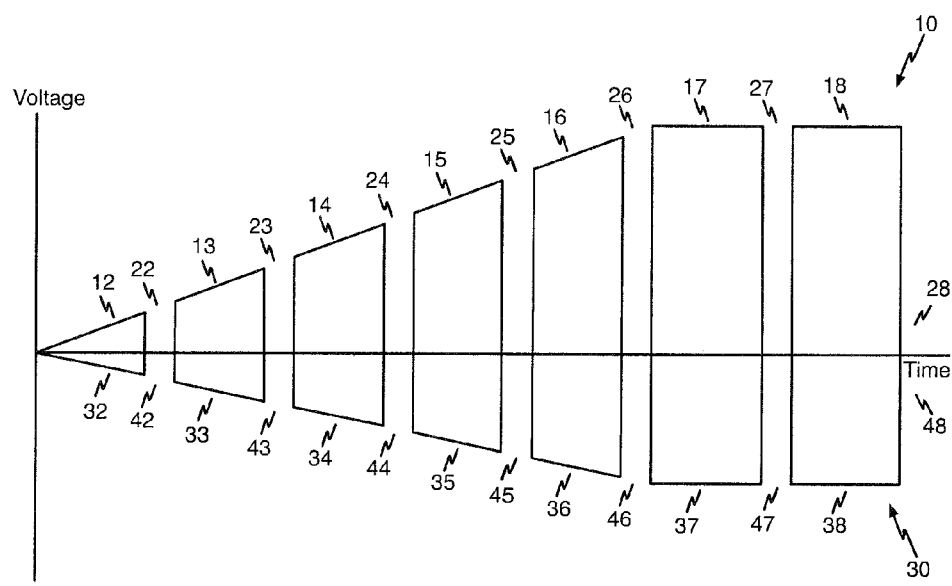
FIG. 2 is a diagram showing an illustrative segmented ramping programming pulse according to the present invention.

According to one aspect of the present invention, a segmented write pulse is used on the gate and bitline voltages with intermediate compare operations to check the programming results. Programming segments are followed by compare segments during which input data is compared to the output of the flash memory cell (for example, a voltage is applied across the cell, and any current flowing across the device is measured). During each compare segment a decision is made to apply the next portion of the programming pulse or stop if sufficient programming has been achieved. If more programming is required the voltages on the word line and bitline are ramped or stepped back to their previous levels, continuing the pulse. If sufficient programming has been achieved the write pulse terminates. This thus reduces the gate disturb seen by the erase population and if the implementation of the compare operation is sufficiently fast an improvement in programming speed may also be obtained because the length of the programming pulse may be decreased. Furthermore, drain disturb on cells in unselected rows sharing common bitlines can also be reduced by inhibiting the bitlines of cells which pass the comparison test Referring now to FIG. 2, a diagram shows an illustrative segmented programming pulse according to the present invention. An upper portion 10 of the waveform of FIG. 2 illustrates the voltage presented to the word (row) line associated with the memory cell to be programmed. A lower portion 30 of the waveform of FIG. 2 illustrates the voltage presented to the bit (column) line associated with the memory cell to be programmed. The lowest level of the upper portion 10 of the waveform represents zero volts and the highest level of the lower portion 30 of the waveform also represents zero volts. As the voltage pulses ramp up, the voltage of the upper portion 10 of the waveform increases and the voltage of the lower portion 30 of the waveform decreases. The total programming potential is the difference in voltage between the trace of the upper portion 10 and the lower portion 30.

The segments of the programming pulses applied to the word and bit lines are coincident with one another. Upper portion 10 of the waveform includes programming segments 12-18 and compare segments 22-28. Lower portion 30 of the waveform includes programming segments 32-38 and compare segments 42-48. Because the programming pulse of FIG. 2 includes compare segments that may be used to determine the actual effect of the previous programming pulse, a programming method implementing the pulse shown in FIG. 2 may be referred to as a "smart" programming method. During each programming segment, the programming potential is stepped up to approximately the ending voltage of the previous programming segment and then ramped to a higher voltage. The programming voltage is ramped to a maximum level selected to protect the memory cell from too high a programming voltage. The programming pulses may be stopped once the maximum voltage has been reached or, as shown in FIG. 2, once the maximum programming voltage is reached, pulses may continue at the maximum voltage for a predetermined number of pulses or a predetermined amount of time.

Only if the addressed word line contains slow-to-program bits will the pulse continue to the maximum level. This thus reduces the gate disturb seen by the population of erased cells and, if the implementation of the compare operation is sufficiently fast, an improvement in programming speed may also be obtained because the length of the programming pulse may be decreased.

Figure 5:
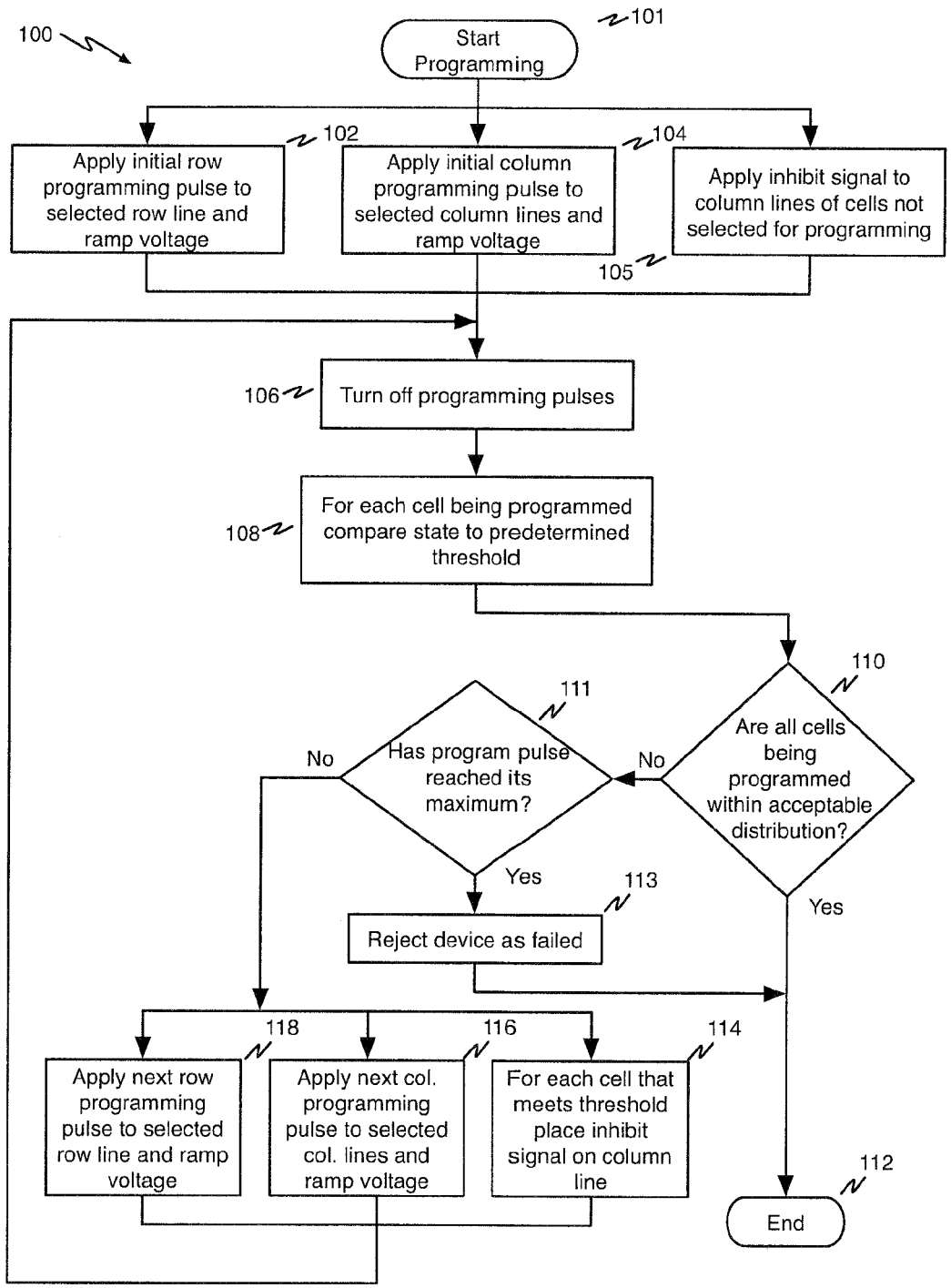
FIG. 5 is a flow chart of a "smart program" method according to an embodiment of the present invention.

Referring now to FIG. 5, a flow chart of a "smart" programming method 100 according to the present invention is shown. In step 101, the programming function is initiated. This may be performed, for example, after a page or bulk erase of a flash device. In the exemplary method shown in FIG. 5, the flash device (e.g., a memory or programmable logic device such as an FPGA) is programmed on a row-by-row basis. Those of ordinary skill in the art will recognize that the terms "row" and "column" are arbitrary designations and are interchangeable, depending on the orientation of the particular array being programmed. In this example, the control gates of a row of flash cells in an array share a common row line or "word line."

Programming is performed by placing a programming potential across selected flash cells to be programmed by charging the relevant word line to a programming voltage (thereby sending the word line programming voltage to all cells in the row) and then charging selected column (bit) lines corresponding to the cells to be programmed to a programming potential. The combination of the row and column voltages creates the potential needed to program the selected cells.

In steps 102 and 104, the initial row and column programming voltage pulses are applied to the selected row and columns to program the selected cells, while in step 105 an inhibit signal is applied to the column lines of the cells in the row that are not being programmed. These steps may be performed by charge pumps and other circuitry, as is known in the art. After a predetermined period of time has elapsed for the initial pulse (as measured by an on or off-chip oscillator, clock, or similar circuit), the programming pulses are turned off in step 106.

In step 108, a compare operation is performed for each cell being programmed. The compare operation compares the state of cells selected for programming to a desired state for programmed cells. This may be performed in multiple ways using circuitry known in the art. As an example, a compare operation may be performed by placing a read voltage, which may be the device operation voltage ($V_{cc}$), for example, about 3 volts, on the control gates of the cells in the row being programmed and reading the current being conducted by each cell selected for programming. By measuring the current of each device, the threshold or "on/off" status the cell can be determined. In step 110, it is determined from the data collected in step 108 whether or not all the cells being programmed in the relevant row are programmed within an acceptable distribution. Steps 108 and 110 may be performed, for example, by circuitry such as the circuitry shown in FIG. 3 (described below).

If all the cells in the relevant row are programmed, the programming process for that row ends at step 112, and the process can begin again for another row on the device. If there are cells that are not within the acceptable distribution for programmed devices, it is determined in step 111 whether the programming pulse has reached a predetermined maximum. The predetermined maximum may be a maximum voltage level, or it may be a maximum number of pulses, or a maximum time or number of clock cycles for performing the programming. If the programming pulse has reached its maximum, and the row contains an unprogrammable cell, the device is rejected as a failed device (step 113), and the process ends at step 112. Alternatively, if there is a cell available to serve as a repair bit, the unprogrammable cell (or entire row) may be logically replaced by the repair bit or row, and the method may be performed on another row to be programmed.

If the programming pulse has not reached its maximum value, the next programming pulse is applied to the cells that are not yet sufficiently programmed in steps 116 and 118.

Steps 114, 116, and 118 are performed contemporaneously. In step 114, for each programmed cell that falls within the acceptable distribution, an inhibit signal is applied to the cell to reduce disturb effects from the control gate voltage that could cause over-programming to occur on the cell. This may be, for example, the same inhibit signal that is applied to the cells on the selected row that are to remain erased, which is also performed as part of step 114. In steps 116 and 118, the next programming pulses in the ramped programming scheme illustrated in FIG. 2 are applied to the row line and column lines for the selected cells remaining to be programmed. The initial voltage applied may be the ending voltage of the previous pulse, which is then ramped up throughout the pulse by circuitry known in the art. After the time has elapsed for the pulse, the method returns to step 106 and turns off the programming pulses (and the inhibit signals) and the loop is performed again as illustrated in FIG. 5. The loop terminates when all the cells to be programmed are within the acceptable distribution, as determined in step 110, or when the programming pulses have ramped to their maximum values, as determined in step 111. In this case, if cells selected for programming remain unprogrammed and are unable to be replaced, the device will be considered a failed device.

Those of ordinary skill in the art will appreciate that the terms "programmed," "erased," "on," and "off" as well as logic designations of "1" and "0" are arbitrary in the flash memory field. For example, in some devices, "programming" could involve placing a negative charge on a floating gate of a flash device, while in other devices designed differently, "programming" could involve removing charge from the floating gate or placing a positive charge on the floating gate. In some devices a logic 1 could correspond to an "on" cell, while in other devices, a logic 1 could correspond to an "off" cell.

Figure 3:
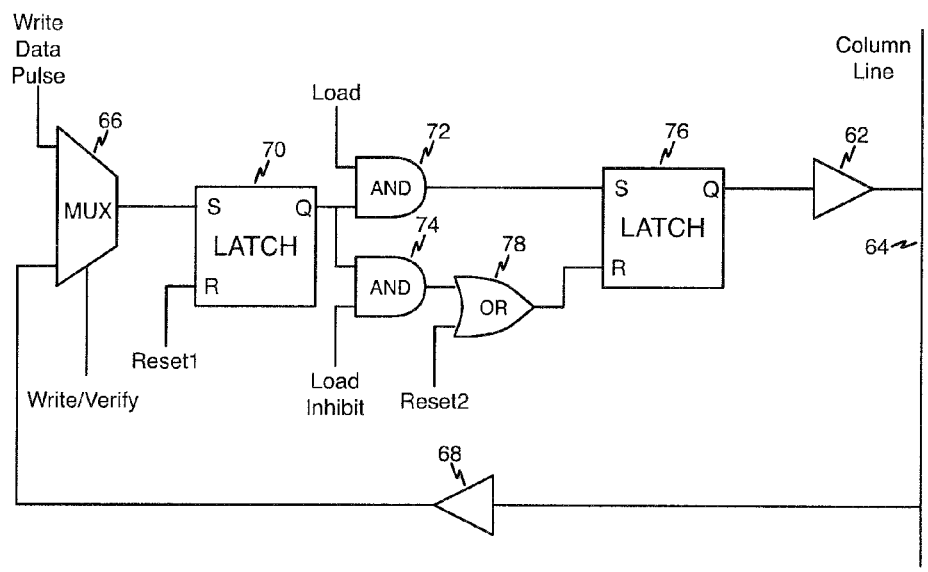
FIG. 3 is a simplified schematic diagram showing an illustrative example of a circuit that may be used to selectively inhibit write pulses to individual flash memory cells that have been sufficiently programmed.

Referring now to FIG. 3, a simplified schematic diagram shows an illustrative example of a circuit 60 that may be used to selectively inhibit write pulses to individual flash memory cells that have been sufficiently programmed. Circuit 60 controls column driver 62, whose purpose is to place a programming potential on bit line 64 to program a flash memory cell at the intersection of bit line 64 and a word line (not shown).

Multiplexer 66 has a first data input onto which a write-data pulse may be driven and a second data input coupled to the output of sense amplifier 68. The input of sense amplifier 68 is coupled to bit line 64. The control input of multiplexer 66 is coupled to a source of a write/verify signal. The output of multiplexer 66 drives the set input of first latch 70. The reset input of first latch 70 is driven by a reset1 signal.

The output of first latch 70 drives one input of each of AND gates 72 and 74. The second input of AND gate 72 is driven by a load signal for a second latch 76, the set input of which is driven by the output of AND gate 72. The second input of AND gate 74 is driven by a load-write-inhibit-data signal. The output of AND gate 74 drives one input of OR gate 78, the other input of which is driven by a reset2 signal. The output of OR gate 78 drives the reset input of second latch 76.

Circuit 60 operates by first resetting the first and second latches 70 and 76 by asserting the reset1 and reset2 signals. Then, with the multiplexer select input in the "write" state, a write pulse is presented to the first data input of multiplexer 66 to set the first latch 70.

The multiplexer select input is then set to the "verify" state and the load signal sets second latch 76 through AND gate 72, and then the reset1 signal is re-asserted and resets first latch 70.

At this point, the segmented write pulses are placed on bit line 64 by column driver circuit 62. During the compare segments of the write pulses of FIG. 2, the output from the flash memory cell being programmed is sensed by sense amplifier 68. After the sense amplifier data has had a chance to settle, the load-write-inhibit-data signal is asserted. So long as the output of sense amplifier 68 is a zero, first latch 70 remains in the reset state, inhibiting both AND gates 72 and 74. During the first compare cycle in which the output of sense amplifier 68 is a logic high level, latch 70 is set, enabling the load-write-inhibit-data signal to be passed to the reset input of second latch 76 through AND gate 74 and OR gate 78. This reset signal causes latch 76 to output a logic low level, which corresponds to an inhibit signal being asserted on column line 64 via column driver circuit 62. Various signals input to a circuit of the type illustrated in FIG. 3 (e.g., write data pulse, write/verify, load write inhibit, reset1, and reset2) may be controlled, for example, by on or off-chip circuitry such as a microcontroller or microcontroller or state machine (an example of an embodiment with an on-chip state machine is described with respect to FIG. 4.

A flash memory having a Word length of n (n flash memory cells per word) will have n circuits 60. The outputs of the second latches in each of the n circuits 60 may be input into an OR gate to produce a program-complete signal. This signal will be asserted when all of the second latches 76 have been reset, i.e. all devices in a row that are to be programmed have been programmed.

Figure 4:
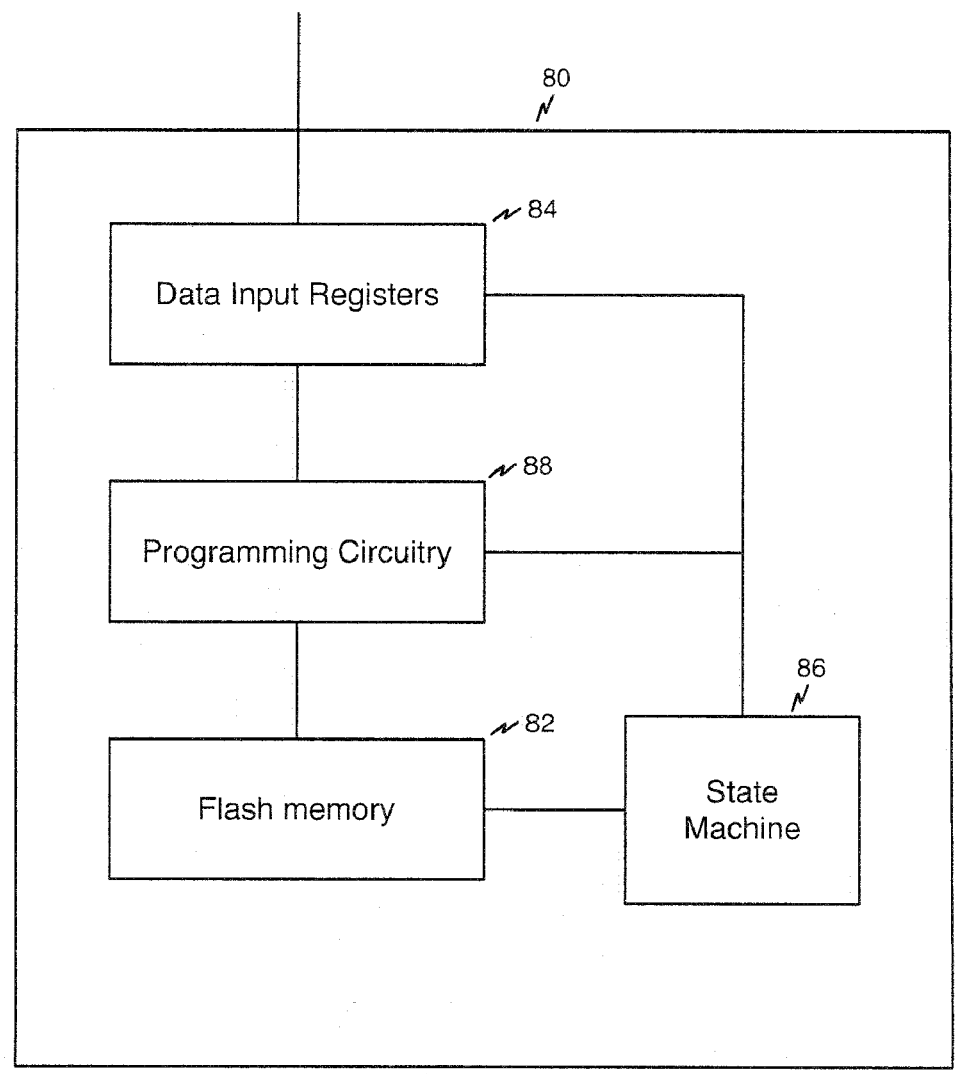
FIG. 4 is a block diagram of an integrated circuit for implementing a method according to an embodiment of the present invention.

According to another aspect of the present invention, the programming method described herein can be implemented on chip, for example, as a hardwired state machine to control the flash memory programming. In this way, the operation of the present invention will be transparent to the user. This aspect of the present invention is illustrated in FIG. 4, which is a block diagram of an integrated circuit 80 embodying this aspect of the present invention. Data to be programmed into the flash memory 82 is placed into data input registers 84. State machine 86 controls the data input registers 84 and the programming circuitry 88 to write the data into flash memory 82. By including state machine 86 in the integrated circuit 80, the programming method of the present invention is transparent to the user, who does not have to know anything about it to use integrated circuit 80.

The smart-write algorithm of the present invention avoids over stressing the tunnel oxide, (using a controllable ramp of both the row and column), reduces or eliminates any programming time increase of the smart write over conventional methods. It also allows rows and columns to be ramped sequentially or simultaneously to tune for minimal disturb, and allows continued smart writing of cells that are not fully programmed, after the waveform amplitude has reached its electrical maximum. The smart write method of the present invention is preferably implemented in on-chip circuitry in the device to make it transparent to the user. This has the further advantage of not violating the security of encrypted programming.

The program method of the present invention may also be employed in an erase operation of non-volatile transistors in a device such as a memory or programmable logic device. The program method provides a "bit-by-bit" granularity that is not available in devices that are typically bulk-erased. That is, the program method of the invention can operate on single bits in the device, where erase operations are performed on a block or device-wide basis. Implementing an erase operation with bit-by-bit granularity would require significant additional circuitry and increase the erase time for the device. Instead of providing a "bit-by-bit" erase operation, the program method of the present invention may be employed in an erase method to achieve a tighter distribution of erased bits.

Figure 6:
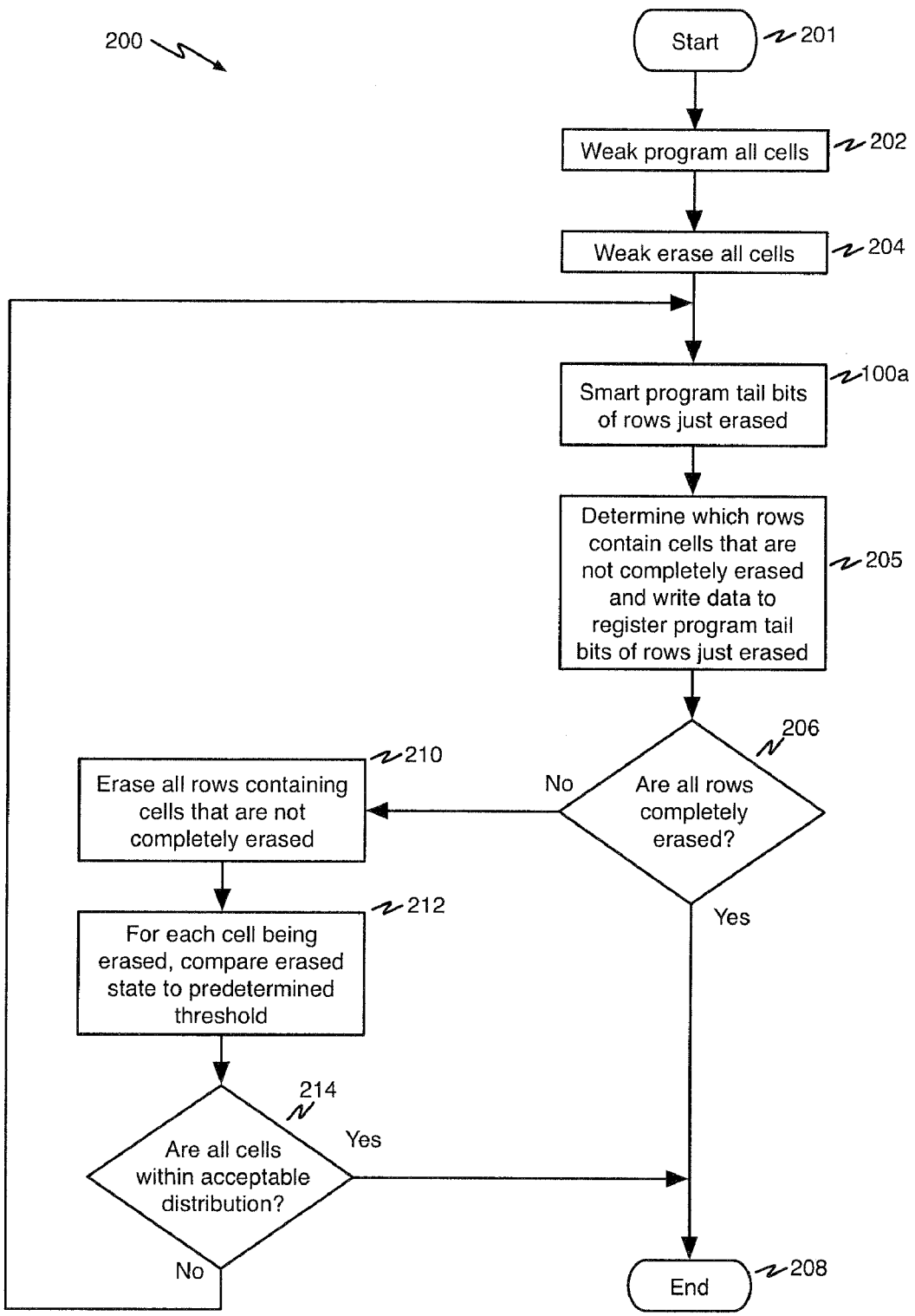
FIG. 6 is a flow chart illustrating use of a "smart program" method in an erase method according to an embodiment of the present invention.

An example of an erase method 200 employing a smart programming method 100 is shown in FIG. 6. In step 201, the erase procedure is started. In step 202, a "weak" program is performed on all cells in the block of the device being erased. This step may be applied, for example, when some of the cells on the device are in a programmed state and others are in an erased state in order to bring the distribution of cell states closer together and reduce the likelihood of creating tail bits by greatly over-erasing some of the already-erased cells in order to fully erase the programmed cells. The weak programming may use voltages, for example, of 50%-80% of the normal programming voltages. Voltages at this level should be enough to move the erased cells into a partially-programmed state, while not significantly further programming the programmed cells. Step 202 will not generally be performed where the portion of the device being erased does not contain cells in different states. In some embodiments of the erase method 200, step 202 will not be performed, even if the portion of the device being programmed contains cells in different states.

In step 204, a "weak" erase is performed on all cells. Similar to the weak program, a weak erase uses voltages, for example, of 50%-80% of the normal erase voltages to move the cells toward an erased state. Following the weak erase step 204, a smart program operation 100a is performed in order to bring the fast bits (tail bits on the "over-erased" side of the distribution) closer to the center of the distribution.

The smart program operation 100a may be performed largely as described and shown in FIG. 5. In contrast to the use of this method to fully program a cell, however, the ramped voltages used in connection with an erase procedure will generally be lower (for example, 50%-80% of normal program voltages). This is because it is not desired to fully program the cells selected to receive the programming pulses, but to make them "less erased" (that is, prevent their erased states from going beyond a selected threshold). For example, in step 108 of smart program operation 100a, the state of the cells being programmed that is compared to a threshold is an erased state being compared to an erase threshold, rather than a programmed state being compared to a programming threshold, as described above. Cells whose erased states exceed the erase threshold will receive an additional programming pulse.

Another potential difference between the method 100 as illustrated in FIG. 5 for a straight programming operation and 100a as implemented as part of an erase operation is that in some embodiments of the erase operation, it may not be known on the first iteration which of the cells are fast tail bits, while it is known during a straight program operation which of the cells are selected for programming. Therefore, all the cells may receive the first (weakest) programming pulse, and no cells will receive an inhibit signal in connection with this initial pulse (step 105 may not be performed during the initial pulse). In this case, after the erase level of each cell is determined, only tail bits will receive programming pulses and other cells will receive inhibit signals. The erase levels of cells in this case may be determined in step 108, for example, by placing a negative or very small positive voltage on the row line, and a positive voltage on the column line for each cell in the row. The row voltage may then be gradually decreased while the sense amplifiers of the device are used to sense whether current is passing through each cell. By determining at what voltage a threshold current pass through each cell (e.g., 20 microamps), the erase level of each cell may be determined.

The information determined in step 108 is may then be used in step 110 to determine which of the cells are most erased. These are the cells most in danger of being over-erased at the conclusion of the erase procedure. In step 110, it is determined if any of the cells have an erased state that is more erased than a predetermined erase threshold. Send program pulses only to the "most erased" of the cells, and to stop sending the program pulses when the erased level of the cell is below a predetermined threshold.

Following the smart erase procedure 100a, it is determined in step 205 whether further erasing of the array is required. This may be done, for example, using data generated during step 100a, or further data may be gathered during step 205 by determining the erase states of all the cells in the array. In step 205, it is determined which rows of the array contain cells that are not completely erased, and this data is stored (e.g., written into a register) for use in performing subsequent steps of the erase procedure. In step 206, it is determined from the data used in step 205 whether all the rows are completely erased (i.e., whether the least-erased cells in each row are all below a predetermined erase threshold. If all rows are completely erased, the procedure terminates at step 208. If further erasing is required, a full-erase (in contrast to the weak erase of step 204) is performed on all rows that are not completely erased (based on the data stored in step 205), using full erase voltages, in step 210. Following the full erase of step 210, the erased state of each cell being erased is compared to a predetermined erase threshold (or thresholds) in step 212. In step 214, it is determined whether all cells that were just erased are within an acceptable distribution (i.e., below the predetermined erase threshold without being over-erased). If all cells are within the acceptable distribution, the process terminates at step 208. If some cells are outside the acceptable distribution, the smart program method 100a is once again performed. The erase thresholds used in the compare steps in 100a may be higher following the weak erase 204 than following the full erase 210.

Once the procedure illustrated in FIG. 6 is completed, the device may be programmed or reprogrammed according to a programming scheme such as described above or as known in the art. Following programming, the programmed and erased cells may be used to store data or in the configuration and operation of a device such as a programmable logic device, for example, a field programmable gate array. Programmable logic devices, including field programmable gate array architectures and methods of operation are known in the art.

Due to the array structure of devices employing non-volatile memory cells, such as non-volatile FPGAs, programming of individual cells results in neighboring cells being stressed. This "disturb" effect can be very significant during programming of a row for the cells in that row that are not selected for programming (unselected columns). This is referred to as "gate disturb." Disturb effects can also be significant for cells in a row that is not being programmed, if cells in the row are on columns that are being programmed in another row. This is referred to as "column disturb." Due to the polarity of the stresses applied, gate disturb and column disturb often affect only the erased, i.e., low threshold voltage ($V_t$) cells. This can have a negative impact on the speed of the device. Typically, gate disturb is dominant over column disturb due to a higher field across the tunnel oxide. However, column disturb can also affect the speed of the device. Specifically, an FPGA two-transistor cell is more sensitive to defects that can cause disturb than the single transistor cells typical of non-volatile memory-only devices. This is because of the large cell area and extra switch transistor in the two-transistor cells. An "adaptive smart program" process allows the program stress to cater to each specific die based on its sensitivity to gate disturb or column disturb thus improving yield and increasing the speed of the device.

A smart programming method may be adapted to compensate for gate and column disturb effects. This may be done by adjusting the programming parameters based on characterization data obtained from performing characterization test and analysis of the device. For example, during characterization, gate and column disturb effects may be intentionally applied to the cells of the device, and the number of failing cells (bits) following each disturb stress is measured and recorded. The number of bits failing from gate disturb on the entire array is measured and compared to the number of bits failing after the column disturb stress. By comparing these two, the die can be determined to be gate disturb sensitive if there are more bits that have failed due to gate disturb than column disturb, and column disturb sensitive if the opposite is true.

Gate disturb sensitive die may be programmed using smart program parameters that ramp the column bias ahead of the gate bias. Column disturb sensitive die are set to ramp the gate bias before the column bias. These smart programming parameters may be stored, for example, in a portion of non-volatile memory resident on the programmable logic device itself. This non-volatile memory may be a re-programmable non-volatile memory such as a flash memory block, or it may be a one-time programmable memory such as a fuse or antifuse based read-only memory block. Alternatively, the parameters may be stored off chip in any known memory device.

Figure 7:
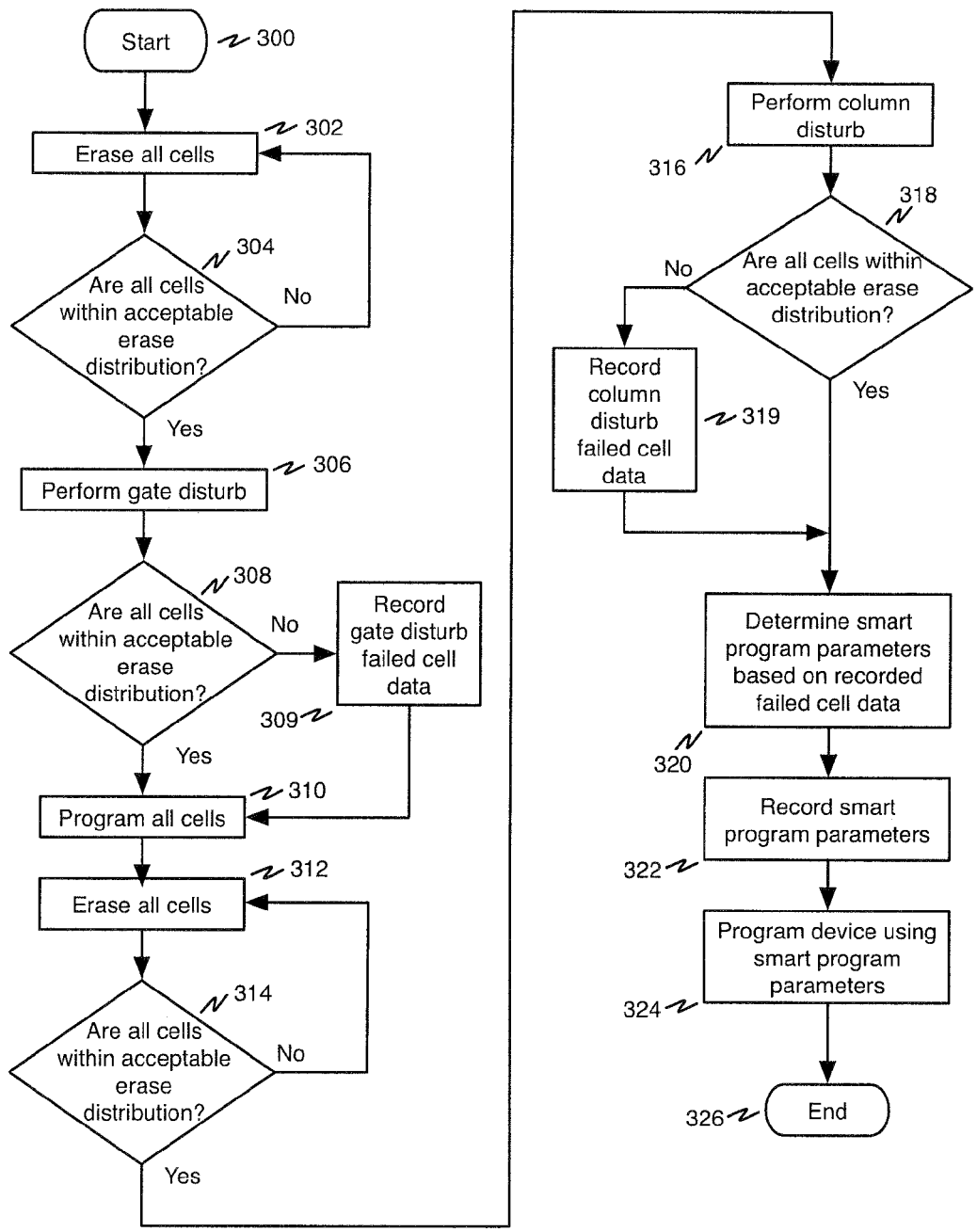
FIG. 7 is a flow chart illustrating an adaptive "smart program" method according to an embodiment of the present invention.

FIG. 7 illustrates an embodiment of a smart programming method according to the present invention. The method illustrated in FIG. 7 involves characterizing a device and adapting a smart programming procedure according to the characterization data of the device, as discussed above. The characterization data may be stored on-chip or off-chip the device being characterized.

As shown in FIG. 7, the process begins in step 300, and in step 302, all cells in the device are erased. A test is then performed in step 304 to determine whether all the cells have been successfully erased. This is sometimes referred to as an "erase verify." If the cells were not all successfully erased, the erase is attempted again. This may be performed for a predetermined number of cycles before the erase is determined to be unsuccessful and the die is determined to be a bad die.

Once the erase has been determined successful, an intentional gate disturb is performed in step 306. To apply gate disturb to all cells, a normal programming pulse may be used except all rows are selected and all columns are unselected. Therefore, programming does not occur, but a disturb effect is generated. In step 308, it is then determined whether the gate disturb has had a large enough impact to push any cells out of the acceptable erase distribution. It should be noted that the threshold used to make this determination need not be whether the gate disturb has forced a device out of its erased state, but may be a determination of whether the device is likely to perform too slowly in operation. If any cells are disturbed beyond the threshold, the failed cell data is recorded (stored) in step 309. This data may be recorded, for example, on-chip in registers or in on-chip volatile or non-volatile memory, or it may be stored off-chip in memory or registers.

Following the recording of any failed cell data, all cells are programmed in step 310. Following programming, all cells are again erased in step 312, and a verify step is performed in step 314. Steps 312-314 may be performed in a similar manner to steps 302-304, as described above. In step 316, a column disturb is applied to all cells. Column disturb is done in a similar way to the gate disturb of step 306, applying the programming pulse with all columns and no rows selected. Steps 318 and 319 are performed similarly to steps 308 and 309, described above.

In step 320, smart program parameters are determined based on the recorded failed cell data. These parameters may be, for example, ramping the column bias ahead of the gate bias for a gate disturb sensitive die or ramping the gate bias before the column bias for a column disturb sensitive die. Sensitivity may be determined, for example, based on comparing the number of cells failing as a result of the column disturb to the number of cells failing as a result of the gate disturb. Alternatively, the sensitivity may be determined based on the severity of the failures, or other parameters based on collected failed cell data.

The smart program data may be generated on a whole die basis, or adapted to any sub-regions of the die (e.g., sectors or rows). In other words, smart program parameters could be developed for each row, based on that row's determined sensitivity. A row-by-row determination is more complicated because each row's column pulse affects all the other rows. For example, if a first row is more sensitive to gate disturb than column disturb and a second adjacent row is more sensitive to column disturb, then programming the first row with a column-first pulse may increase the column disturb on the second row (which is already sensitive to column disturb).

In step 322, the smart program parameters are stored for use in programming the device. The parameters may be stored, for example, in on-board non-volatile memory. In step 324, the device is programmed based on the stored smart program parameters, and the process ends in step 326.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method for programming an array of flash memory cells organized into rows and columns, each cell in each row coupled to a row line and a column line, comprising:
    performing a gate disturb on the flash memory cells;
    if cells fail to meet a predetermined threshold following the gate disturb, recording data for the cells;
    performing a column disturb on the flash memory cells;
    if cells fail to meet a predetermined threshold following the column disturb, recording data for the cells; and
    determining at least one programming parameter based on the recorded data.

2. The method of claim 1, further comprising:
    programming selected ones of the flash memory cells using the programming parameter.

3. The method of claim 2, wherein:
    programming selected ones of the flash memory cells using the programming parameter includes programming the selected ones of the flash memory cells to control the configuration of a programmable logic device.

4. The method of claim 3, wherein:
    the programmable logic device is a field programmable gate array.

5. The method of claim 1, further comprising:
    erasing the flash memory cells before performing the gate disturb; and
    erasing the flash memory cells before performing the column disturb.

6. The method of claim 5, further comprising:
    verifying the erasing of the flash memory cells before performing the gate disturb; and
    verifying the erasing of the flash memory cells before performing the column disturb.

7. The method of claim 1, wherein the flash memory cells are disposed on a semiconductor die, the method further comprising:
    storing at least one programming parameter in a memory disposed on the semiconductor die.

8. The method of claim 7, wherein the memory is a flash memory.

9. The method of claim 7, wherein the memory is an antifuse-based memory.

10. In an erase method for erasing an array of flash memory cells organized into rows and columns, each cell in each row coupled to a row line and a column line, a method for reducing over-erase of the cells comprising:
    following an initial erase of the array, selecting a row for an over-erase reducing operation;
    concurrently applying an initial row programming voltage pulse to the row line, and an initial column programming voltage pulse to the column lines coupled to each cell in the selected row;
    following the initial row and column programming voltage pulses, comparing an erased state of each of the cells in the selected row to a predetermined threshold; and
    if the erased state of at least one of the cells in the selected row exceeds the predetermined threshold:
        concurrently applying a next row programming voltage pulse to the row line and a next column programming voltage pulse to the column line coupled to each cell in the selected row whose erased state exceeds the predetermined threshold.

11. The method of claim 10, further comprising:
    programming selected ones of the flash memory cells to control the configuration of a programmable logic device.

12. The method of claim 11, wherein the programmable logic device is a field programmable gate array.

13. The method of claim 10, wherein:
    concurrently applying a next row programming voltage pulse to the row line and a next column programming voltage pulse to the column line coupled to each cell in the selected row whose erased state exceeds the predetermined threshold includes:
    applying an inhibit signal to the column line coupled to each cell whose erased state meets the predetermined threshold.

14. The method of claim 10, further comprising:
    cycling steps of:
        comparing to the predetermined threshold, the erase state of each of the cells in the selected row whose erase state exceeded the predetermined threshold in a last compare; and concurrently applying a next row programming voltage pulse to the row line and a next column programming voltage pulse to the column line coupled to each cell in the selected row whose erase state exceeded the predetermined threshold;

until at least one of the following conditions occurs:

the erased state of each cell in the selected row meets the predetermined threshold; and the programming voltage pulse has reached a predetermined maximum.

15. The method of claim 14, wherein the predetermined maximum of the programming voltage pulse comprises at least one of: a maximum voltage, a maximum number of pulses; a maximum time period, and a maximum number of cycles.

16. The method of claim 10, wherein the flash cells are on an integrated circuit comprising a programmable logic device and at least a portion of the flash cells are used to configure programmable logic of the programmable logic device.

17. The method of claim 16, wherein the programmable logic device is a field programmable gate array.

* * * * *